(12) United States Patent
Büber et al.

(10) Patent No.: US 10,651,528 B2
(45) Date of Patent: May 12, 2020

(54) BROADBAND DIRECTIONAL COUPLERS FOR TEM AND QUASI-TEM MODE GUIDES AND LINES

(71) Applicant: Maury Microwave, Inc., Ontario, CA (US)

(72) Inventors: M. Tekamül Büber, Anaheim, CA (US); Sathya Padmanabhan, Glendora, CA (US)

(73) Assignee: Maury Microwave, Inc., Ontario, CA (US)

( * ) Notice: Subject to any disclaimer, the term of this patent is extended or adjusted under 35 U.S.C. 154(b) by 43 days.

(21) Appl. No.: 15/823,463

(22) Filed: Nov. 27, 2017

(65) Prior Publication Data

US 2019/0165445 A1   May 30, 2019

(51) Int. Cl.
| | |
|---|---|
| H01P 5/18 | (2006.01) |
| H01P 5/02 | (2006.01) |
| H01P 3/08 | (2006.01) |
| H01P 5/08 | (2006.01) |
| G01R 27/32 | (2006.01) |

(52) U.S. Cl.
CPC .............. *H01P 5/184* (2013.01); *H01P 3/081* (2013.01); *H01P 5/026* (2013.01); *H01P 5/085* (2013.01); *H01P 5/183* (2013.01); *H01P 5/187* (2013.01); *G01R 27/32* (2013.01)

(58) Field of Classification Search
CPC .......... H01P 5/183; H01P 5/184; H01P 5/026; H01P 5/085; H01P 3/081
USPC .................. 333/109, 111, 112, 114, 115, 116
See application file for complete search history.

(56) References Cited

U.S. PATENT DOCUMENTS

| | | | | |
|---|---|---|---|---|
| 2,473,274 | A * | 6/1949 | Bradley | ............... H01P 5/18 333/114 |
| 2,602,859 | A * | 7/1952 | Moreno | ............... H01P 5/181 333/114 |
| 3,575,674 | A * | 4/1971 | Howe, Jr. | ............... H01P 5/187 333/116 |

(Continued)

FOREIGN PATENT DOCUMENTS

| | | |
|---|---|---|
| CN | 102820511 A * | 12/2012 |
| CN | 202749492 U | 2/2013 |

(Continued)

OTHER PUBLICATIONS

Ginzton, Edward L., A Note on Coaxial Bethe-Hole Directional Couplers, 1950, IRE Proceedings, 5 pages.*

(Continued)

*Primary Examiner* — Dean O Takaoka
(74) *Attorney, Agent, or Firm* — Larry K. Roberts

(57) ABSTRACT

A directional coupler operable at microwave and RF frequencies. Embodiments of directional coupler includes a main transmission line supporting transverse electromagnetic (TEM) or quasi-TEM wave mode propagation. A coupled transmission line supports TEM or quasi-TEM wave mode propagation. The coupled transmission line is adjacent to and oriented at an angle with respect to the main transmission line. A coupling hole is formed through conductive shielding between the main and coupled lines, the coupling hole formed at an intersection region between the main and coupled lines. The angle is nominally 60 degrees for optimal directivity and isolation.

20 Claims, 7 Drawing Sheets

(56) References Cited

U.S. PATENT DOCUMENTS

| | | | | |
|---|---|---|---|---|
| 4,041,416 | A | * 8/1977 | Glance | H03L 1/021 |
| | | | | 331/176 |
| 4,737,740 | A | * 4/1988 | Millican | H01P 5/187 |
| | | | | 333/116 |
| 4,801,903 | A | 1/1989 | Mohr | |
| 5,303,419 | A | * 4/1994 | Ittipiboon | H01P 5/20 |
| | | | | 333/121 |
| 5,407,905 | A | * 4/1995 | Das | H01P 5/181 |
| | | | | 333/114 |
| 7,282,926 | B1 | 10/2007 | Verspect | |
| 7,429,903 | B2 | * 9/2008 | Antkowiak | H01P 5/183 |
| | | | | 333/109 |
| 9,123,979 | B1 | * 9/2015 | Izadian | H01P 3/18 |
| 9,184,484 | B2 | * 11/2015 | Tanbakuchi | H01P 5/185 |

FOREIGN PATENT DOCUMENTS

| | | | | |
|---|---|---|---|---|
| RU | 741729 | A1 * | 5/1997 | H01P 5/18 |
| SU | 1062815 | A1 * | 12/1983 | H01P 5/18 |

OTHER PUBLICATIONS

E. Miralles et al., Cross-guide Moreno directional coupler in empty substrate integrated waveguide, 2017, AGU Radio Science, 10.1002/2017RS006244, pp. 597-603.*

David M. Pozar, Microwave Engineering, Second Edition, John Wiley & Sons, Inc; 1997, pp. 369-372.

Hewlett-Packard, A Precision Directional Coupler Using Multi-Hole Coupling, Journal, Mar.-Apr. 1952, vol. 3 No. 7-8, Hewlett-Packard Company, Palo Alto, California United States of America.

Mehul P. Vanvi, Ved Vyas Dwivedi, Jaymin K. Bhalani., Design of 20 dB Bethe-hole Waveguide Coupler, International Journal of Engineering Trends and Technology (IJETT), Apr. 2013, vol. 4 Issue 4, Communication System Engineering, Charusat University At & Po: Changa-388421, Dist-Anand, India.

H. Downs, P. Matthews, W. Sanborn, Mega Industries LLC, Gorham, Maine USA, Waveguide Directional Couplers for High Vacuum Applications, Proceedings of EPAC08, Genoa, Italy, 2008.

Maury Microwave, Low-Loss Couplers, Data Sheet, Aug. 2017, 2 pages, Ontario, California.

Edward L Ginzton et al.; A Note on Coaxial Bethe-Hole Directional Couplers, Proceedings of the Ire, Mar. 1, 1950, pp. 305-309, XP055554788, DOI:10.1109/JRPROC.1950.231087.

International Search Report and Written Opinion of the International Searching Authority, International Application No. PCT/US2018/060022, dated Feb. 25, 2019.

* cited by examiner

BROADBAND DIRECTIONAL COUPLERS FOR TEM AND QUASI-TEM MODE GUIDES AND LINES

BACKGROUND

Directional couplers are among very important components for RF/microwave circuits, design, and measurements. Two major shortcomings of most current directional couplers used for coaxial, strip or microstrip transmission lines, or slab lines or similar guides and lines with TEM mode propagation are narrow bandwidth for isolation/directivity and large size. The size is dictated because quarter wave coupling is required on most designs. Another shortcoming is the lack of low loss couplers for coaxial lines, which is very important for many RF/microwave test and measurement systems such as load/source pull measurements.

It would be advantageous to provide couplers which overcome these difficulties by making the size of the coupler significantly small, the band width for isolation/directivity high and the losses low.

DETAILED DESCRIPTION

Figure 1:
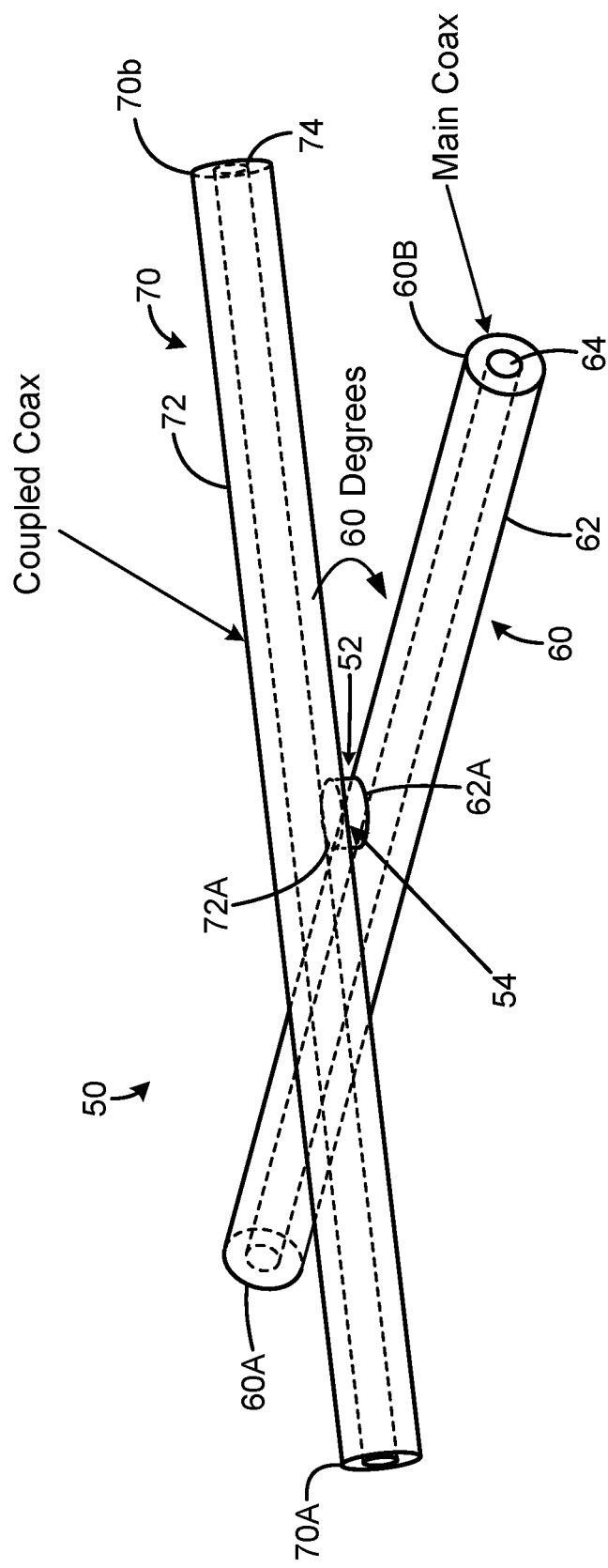
FIG. 1 is a simplified schematic isometric view of an exemplary embodiment of a coaxial line to coaxial line directional coupler.

In the following detailed description and in the several figures of the drawing, like elements are identified with like reference numerals. The figures may not be to scale, and relative feature sizes may be exaggerated for illustrative purposes.

Wide band coupling between two TEM wave mode transmission lines with high isolation/directivity and wide band behavior with low insertion loss and good matching at the main line ports is described. The principles apply to all TEM and quasi-TEM mode transmission lines. As is well known in the art, TEM mode refers to transverse electric and magnetic fields which are perpendicular to each other and perpendicular to the direction of propagation of the wave, and neither the electric nor the magnetic fields have longitudinal components, and that can propagate from DC to higher frequencies as opposed to the modes in waveguides. A quasi-TEM wave mode exists in a microstrip line, and refers to the fact that the wave resembles a TEM wave in that the signal can propagate towards DC, although it does have a minimal longitudinal component.

Figure 2:
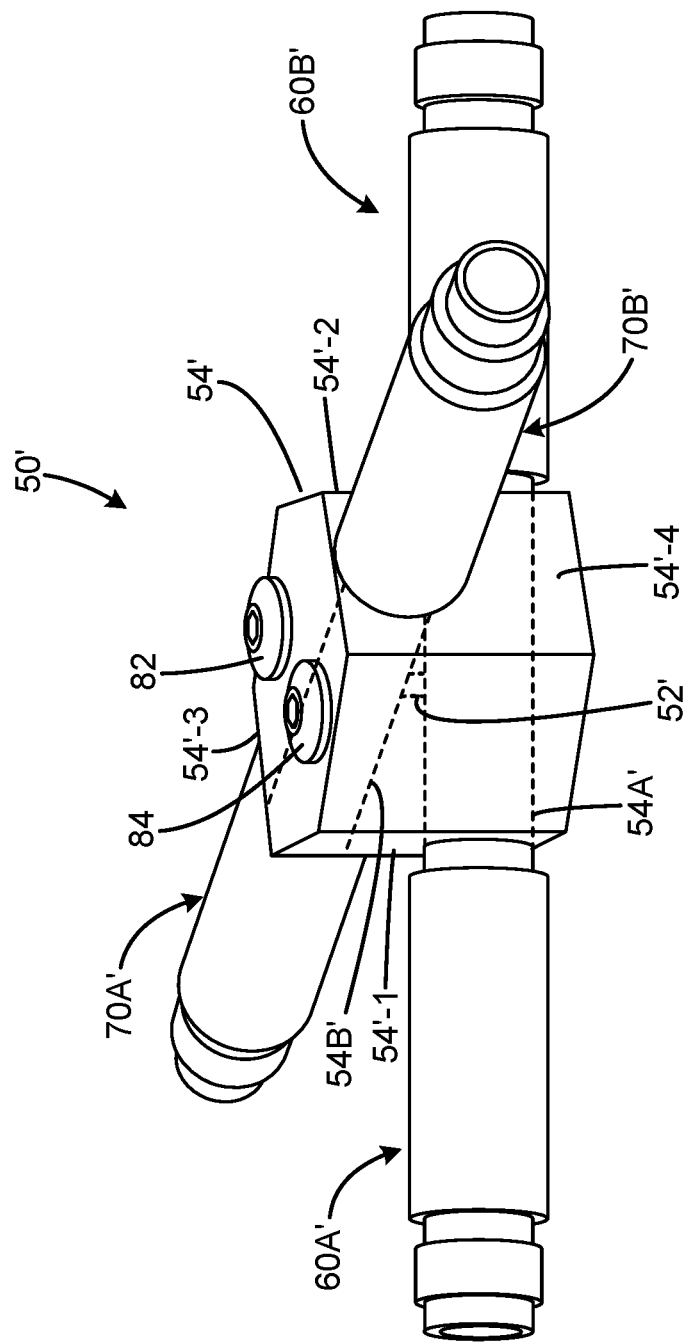
FIG. 2 is an isometric view of another exemplary embodiment of a coaxial line to coaxial line directional coupler.

A first embodiment of a directional coupler 50 in accordance with aspects of this invention is illustrated in FIG. 1. The coupler 50 includes a main coaxial line 60 and a coupled coaxial line 70. The main coaxial line 60 includes an electrically conductive outer conductor 62 and an electrically conductive inner conductor 64, with ports 60A, 60B. Similarly, the coupled coaxial line 70 includes an electrically conductive outer conductor 72 and an electrically conductive inner conductor 74, with ports 70A, 70B. The ports may be connected to connectors, for an exemplary standalone coupler device, as shown in FIG. 2, or integrated into a system.

The coaxial lines 60 and 70 may not be the same size (diameter). It may be preferable in some applications to use a smaller diameter coupled line relative to the main line.

Still referring to FIG. 1, a signal propagating in the main coaxial line 60 is coupled to the second coaxial line 70 through respective single holes 62A, 72A defined in the outer conductor of each coaxial line, at the center of an intersection region 52 between the lines. An electrically conductive connector structure 54 may be used to join the main line and coupled lines together, for mechanical support and to prevent signal leakage. The two coaxial lines are oriented at an angle with respect to each other, nominally at 60 degrees independent of coaxial line size or frequency. If the lines are not at substantially 60 degrees, the directivity of the coupler will be reduced significantly.

The size of the coupling holes is an important parameter for the coupling factor. The smaller the hole, the lower the coupling. As the hole becomes larger, the coupling increases but at the same time the signal in the main line will also get distorted; the size of the hole effects the signal in the main line. In a given application, the designer will find the best or acceptable compromise for each coaxial line and coupling specification. In any case, the hole diameter should be kept smaller than the outer diameter of the coaxial lines, or smaller than the outer diameter of the smaller coaxial line if one is smaller than the other, typically the coupled line. In general, one would be inclined to use a smaller diameter coaxial line for the coupled line.

The theory of the coupling is simple and the final derivation shows that the angle ($\theta$) between the main line conductor and the coupled line conductor is chosen for all TEM/quasi-TEM mode transmission lines such as coaxial lines, slab lines, microstrip or strip lines, etc., by $$\cos \theta = 1/2$$

This angle gives the maximum directivity/isolation for a chosen coupling factor. The coupling factor is achieved by adjusting the size of the coupling holes between the coaxial lines and/or by bringing the two coaxial lines together or separating them further away from each other. The connection of the two lines through the coupling holes should be closed from the external environment and shielded to prevent leakage.

A coupler embodiment as shown in FIG. 1 has been simulated, using 1.85 mm coaxial lines. The simulations show that the coupler works well from approximately 2 GHz up to 67 GHz. 67 GHz is the upper frequency of the usable range of the 1.85 mm coaxial line. If one used 1 mm coax, the upper frequency limit would be even higher, on the order of 110 GHz. For other coaxial standards such as 2.4 mm, 2.92 mm, or 3.5 mm, or Type-N, or 7 mm connector sizes, the usable frequency range widens at the lower end of frequencies below 2 GHz while at the higher end it is limited by the usable maximum frequency of the respective coaxial standard. By coaxial standards such as 2.4 mm, etc., this refers to an air coaxial transmission line with the same diameter dimensions of the similarly named coaxial connectors.

FIG. 2 shows an alternate embodiment of a coaxial line to coaxial line directional coupler 50'. In this embodiment, two holes or passageways 54A', 54B' (shown in phantom lines) are formed through a hexagonal block 54' (with faces at 60-degree orientation from adjacent faces (i.e. the angle between the normal vectors to the adjacent faces is 60 degrees) formed of an electrically conductive material such as aluminum. The passageways 54A', 54B' are formed at a 60-degree angle, with a coupling passageway 52' between the main line and coupled passageways at an intersection area within the block 54'. The block 54' contains the passageways 54A', 54B' and 52', preventing any leakage. In this embodiment, the inner surfaces of the passageways 54A', 54B' constitute the outer conductors of the coaxial lines 60', 70'. The center conductors of each coaxial line are inserted through the holes 54A'. The connectors 60A', 60B', 70A', 70B' are attached at the respective hole faces 54'-1, 54'-2, 54'-3, 54'-4 of the block. The block may also be formed of a plastic material coated with a metal layer.

Dielectric spacers between the coaxial line center conductors and outer conductors are typically not needed, since the device connectors typically have dielectric beads, holding the center conductors in place. Since this exemplary device is small and short (the body 54' needs only to be large enough to enclose the cross section and the coupling hole between the two coaxial lines, which is an extremely small size), no other supports are typically necessary. Additional dielectric support may be used, but may increase the insertion loss.

The coupler 50' of FIG. 2 may be fabricated to be electrically the same as the coupler 50 of FIG. 1. The two outer conductors 62, 72 of the coupler 50 correspond to the holes or passageways 54A', 54B' in FIG. 2. One exemplary technique to fabricate the coupler 50' is to make first the hexagonal block 54' of FIG. 2 from conductor material or non-conductor material as a unitary structure, then slice it horizontally symmetrically in the middle. Small coupling holes can be drilled at the center inside each of the two halves such that, when the two halves are assembled, form coupling hole 52', corresponding to coupling holes 62A and 72A in the embodiment of FIG. 1. The two halves are then assembled together and fastened together with screws 82, 84. The holes or passageways 54A', 54B' are then drilled through the block 54' at 60 degrees, to form the outer conductors of the coaxial lines. If non-conductive material is used to fabricate the block 54', at least the interior surfaces are coated with conductive material.

Figure 3:
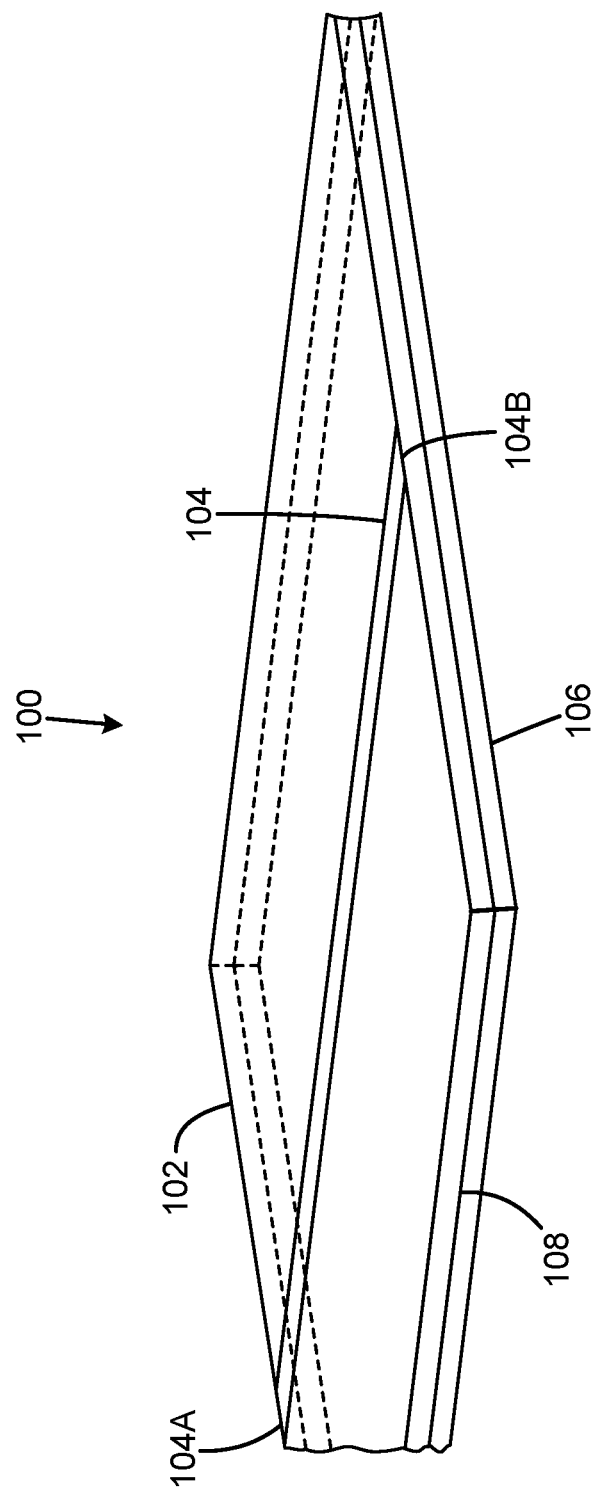
FIGS. 3 and 4 are simplified schematic isometric views illustrating features of an exemplary embodiment of a microstrip to microstrip directional coupler.
Figure 4:
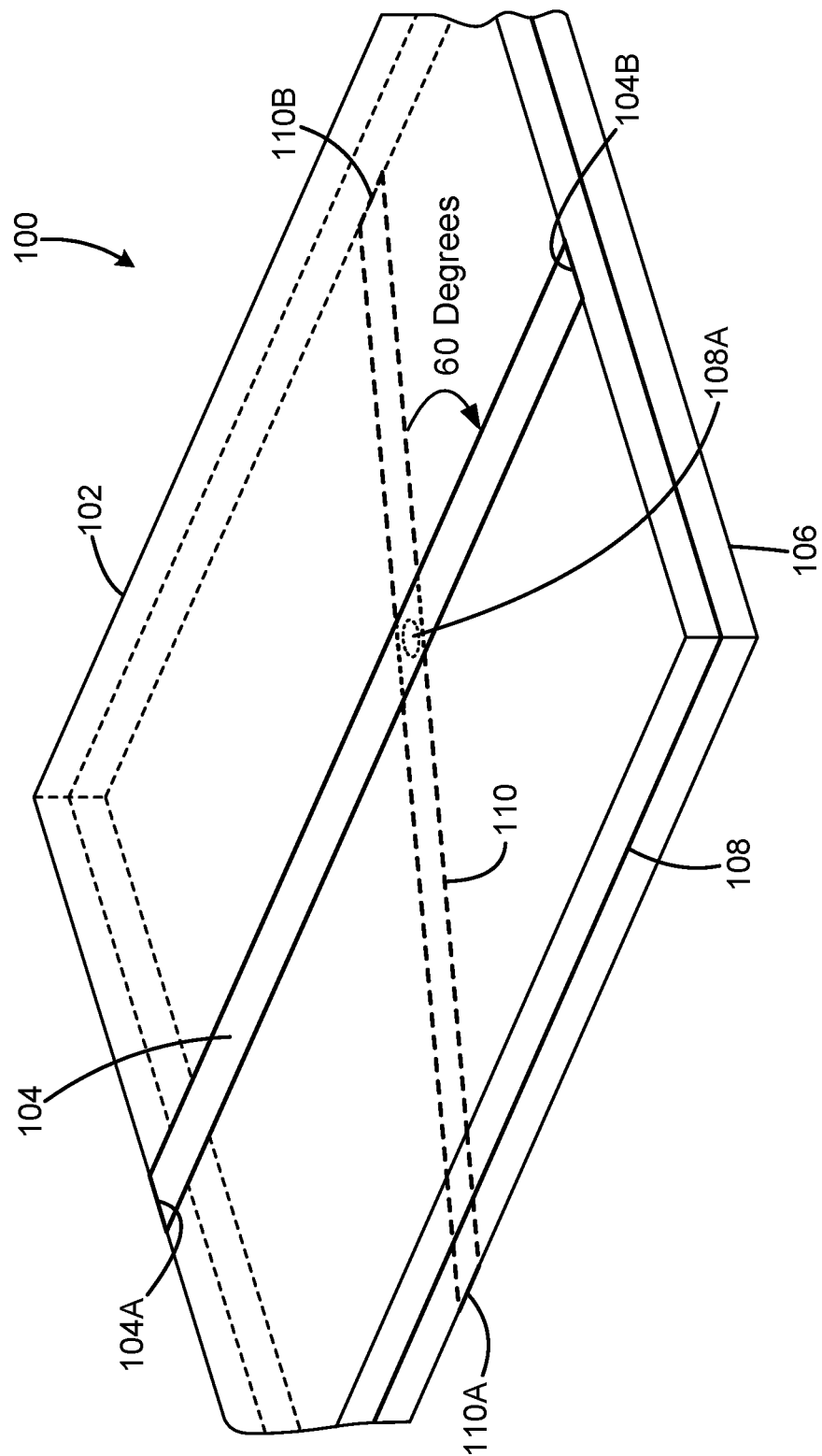

A further embodiment of a directional coupler 100 is illustrated in FIGS. 3 and 4. The coupler 100 is a microstrip to microstrip directional coupler. The coupler includes a main microstrip electrical conductor 104 fabricated on the surface of main dielectric substrate 102, with ports 104A, 104B. An electrically conductive planar conductor layer 108 is fabricated on the opposite surface of the main substrate 102.

The planar conductor layer 108 is sandwiched between a coupled line dielectric substrate 106 and the main line substrate 102. A coupled microstrip conductor 110 is fabricated on the bottom surface of the coupled line substrate 106, and is arranged at an angle with respect to the main microstrip conductor line 104; the angle is 60 degrees in this embodiment for optimal directivity and isolation.

A coupling hole 108A is formed in the conductor layer 108 at the intersection of the main and coupled conductor lines 104, 110. The coupling hole allows energy propagating along the main microstrip line to couple to the coupled line 110. The size of the coupling hole 108A, and the thickness of the dielectric substrates will affect the coupling factor of the microstrip to microstrip coupler 100. The usable frequency range of the microstrip lines and connectors is the primary factor in the frequency range of the coupler. The coupler 100 will typically be enclosed in a conductive housing, with air gaps between the housing and the outer surfaces of the substrates.

Figure 6:
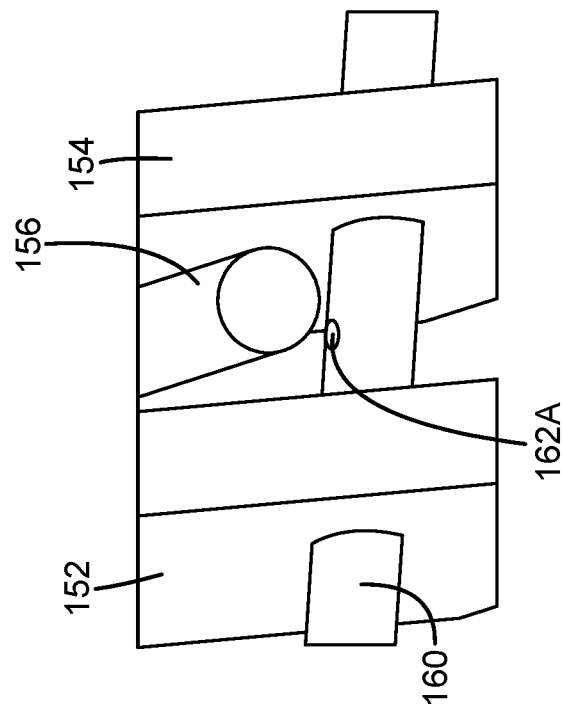
FIG. 6 is a partially broken-away portion of the coupler of FIG. 5, showing the arrangement of the coupling hole in the outer conductor of the coupled coaxial line.
Figure 5:
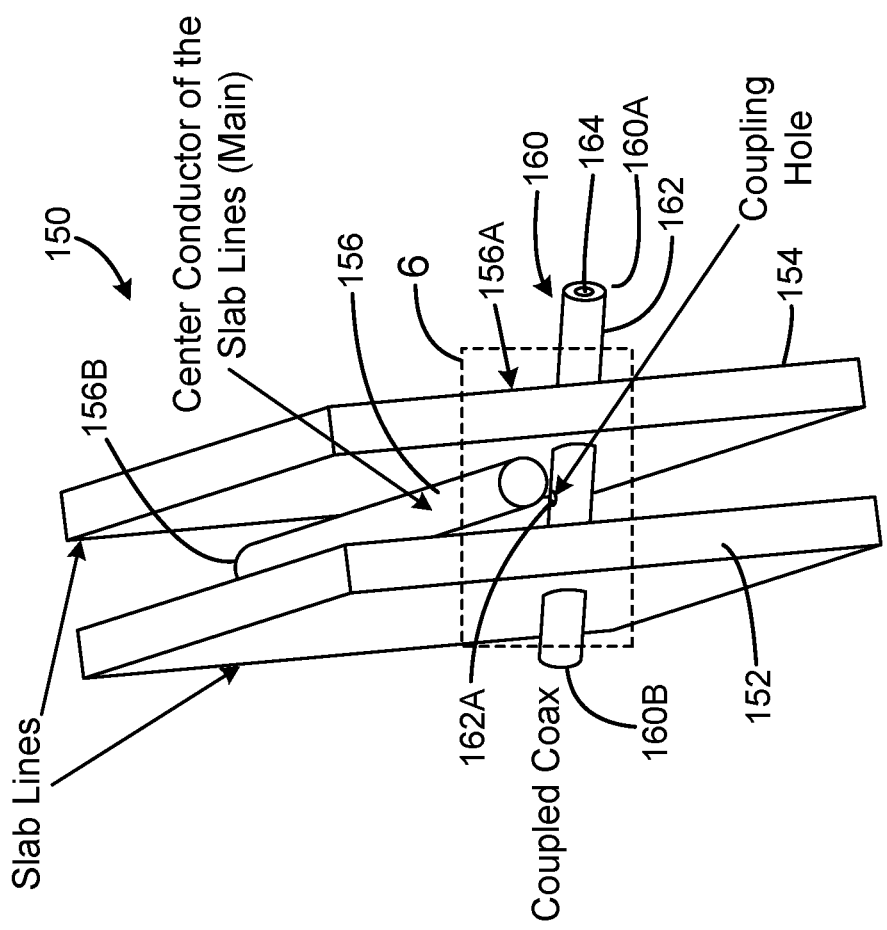
FIG. 5 is a simplified isometric view illustrating an exemplary embodiment of a slab line to coaxial line directional coupler.
Figure 7:
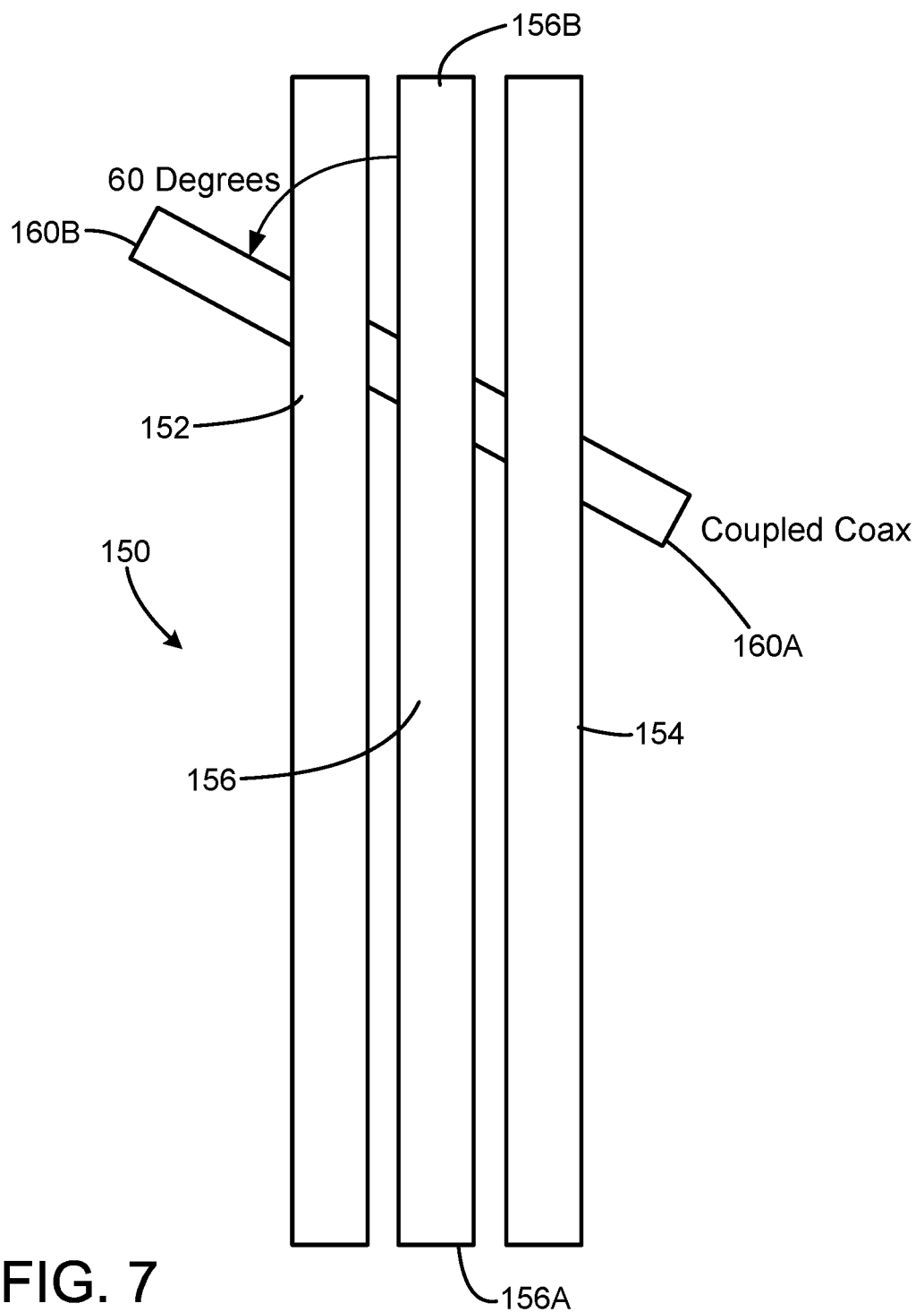
FIG. 7 is a simplified top view of the coupler of FIG. 5, illustrating the angular orientation of the coupled coaxial line to the center conductor of the slab line.

A further coupler embodiment 150 is illustrated in FIGS. 5-7. This embodiment is a slab line to coaxial line coupler 150, in which the slab line is formed by the parallel opposed slab conductor lines or planes 152, 154 and center conductor 156. This slab line structure 152, 154 and 156 is the main transmission line, with ports 156A, 156B formed by the end faces of the slab conductor planes and the end face of the center conductor. A coupled coaxial line 160 is passed through openings formed in the slab conductor planes, at a nominal angle of 60 degrees with respect to the center conductor 156. The coupled coaxial line includes the outer coaxial conductor 162 and inner conductor 164, and forms ports 160A, 160B. A coupling hole 162A is formed in the outer coaxial conductor 162 at an area facing the slab line center conductor 156.

As shown in FIG. 7, the coupled coaxial line is positioned relative to the center conductor 156 (as well as the slab lines 152, 154, since the slab lines and the center conductor should be parallel) at an angle of 60 degrees in this exemplary embodiment. The coupling hole 162A allows energy propagating along the main slab line center conductor 156 to couple to the coupled coaxial line 160. The size of the coupling hole 162A, and the distance between the center conductor and the coupling hole will affect the coupling factor of the slab line to coaxial coupler 150.

The usable frequency range of the slab line and its connectors is the main factor for the limits of the directional coupler 150. As in the coaxial line-to-coaxial line example, the directional coupler 150 is extremely wide band.

Figure 8:
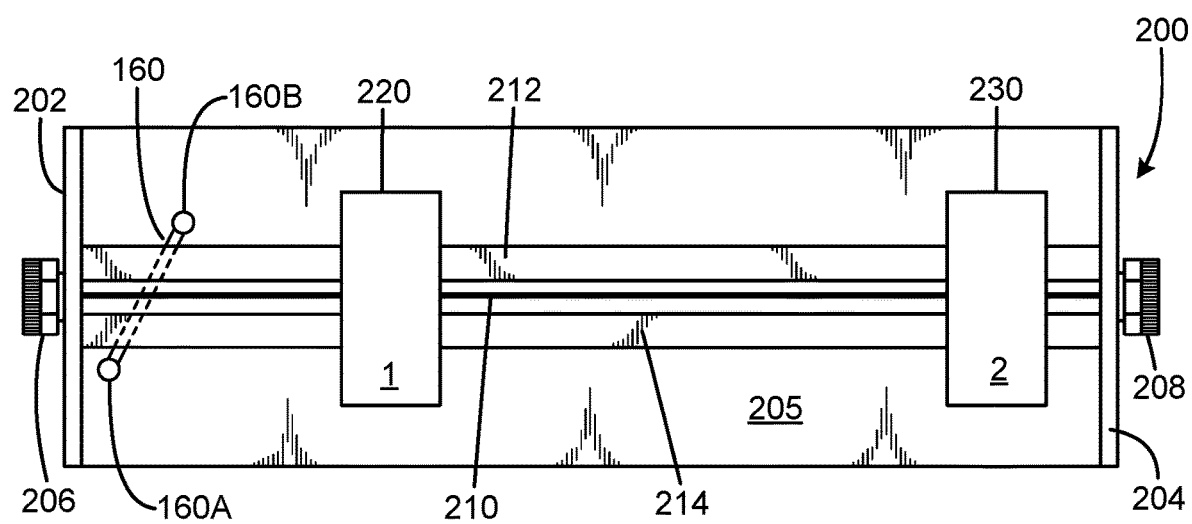
FIG. 8 is a simplified top view of a mechanical slab line impedance tuner with a directional coupler as in FIGS. 5-7 integrated with the tuner.

An exemplary application for a slab line to coaxial line directional coupler is in mechanical slab line impedance tuners. FIG. 8 illustrates an exemplary embodiment of a two-carriage impedance tuner 200, in which each of N carriages, here two carriages 220 and 230, is positionable along the slab line center conductor 210, positioned between the slab conductors 212 and 214. The number N of carriages may be one or more than two, depending on the application. The tuner 200 includes a pair of opposed or end walls 202 and 204 on which the center conductor 210 is supported by dielectric bushings (not shown). The end walls are mounted to a bottom plate 205. The opposed slab conductor planes 212, 214 are supported between the end walls. RF connectors 206, 208 are provided for making electrical connection to the center conductor on opposed sides of the tuner. Connector 206 is typically connected or coupled to a device under test (DUT).

Still referring to FIG. 8, probe carriages 220 and 230 are mounted for movement along an axis parallel to the center conductor 210. Typically, the carriages are mounted on guide rails (not shown in FIG. 8). One rail may have a linear gear rack, for engagement by a rotatable gear mounted on each carriage and driven by a carriage motor, typically a stepper motor, although other types of motors may alternately be employed. By driving the rotatable gear with the carriage motor, a carriage can be moved along the horizontal direction, along the center conductor. Since each carriage motor can be independently driven, this allows the carriages to be positioned independently of each other. Other arrangements for positioning the carriage may also be employed, e.g. drive belts or leadscrews.

Each probe carriage 220, 230 also carries one or multiple probes, each positionable at variable heights, i.e. vertically, with respect to the center conductor. For example, a probe motor may be carried by the carriage, and configured to move the probe to different positions relative to the center conductor.

The carriage and probe drive systems are controllable electronically, typically by a tuner controller. Exemplary tuner drive systems and controllers are described, for example, in U.S. Pat. Nos. 8,823,392 and 8,907,750, the entire contents of which are incorporated herein by this reference.

The impedance tuner 200 includes a slab line to coaxial line directional coupler including coupled coaxial line 160, as in FIGS. 5-7, integrated into the tuner. As shown in FIG. 8, the coupled coaxial line 160 is positioned adjacent the end plate 202, with the coaxial line 160 positioned through openings formed in the slab conductor planes 212, 214. The coaxial line 160 is positioned at a 60-degree angle with respect to the center conductor 210 of the slab line. Coaxial connectors 160A, 160B are mounted at the coaxial line ports. A coupling port (not visible in FIG. 8) is formed in the outer conductor of the coaxial line 160 under the center conductor, as described with respect to the coupler of FIGS. 5-7. The coaxial line may be connected to a measurement device such as a network analyzer to monitor coupled RF energy from the slab line. The coupled coaxial line 160 is mounted under the center conductor 210, with the probe carriages running above the center conductor. The coupled coaxial line 160 may be mounted at either end of the tuner, or at both ends, and preferably outside the travel ranges of the carriages 220, 230.

Although the foregoing has been a description and illustration of specific embodiments of the subject matter, various modifications and changes thereto can be made by persons skilled in the art without departing from the scope and spirit of the invention.

What is claimed is:

1. A directional coupler operable at microwave and RF frequencies, comprising:
   a main transmission line supporting transverse electromagnetic (TEM) or quasi-TEM wave mode propagation;
   a coupled transmission line supporting TEM or quasi-TEM wave mode propagation, the coupled transmission line adjacent to and oriented at an angle with respect to the main transmission line;
   a coupling hole formed through conductive shielding between the main and coupled lines, the coupling hole formed at an intersection region between the main and coupled lines; and wherein
   the main transmission line is a main slab line comprising spaced, opposed conductor planes and a main center conductor;
   the coupled transmission line is a coupled coaxial line comprising a center coaxial conductor; and an outer conductor; and
   the coupling hole comprises a hole formed in the coaxial outer conductor at the intersection region.

2. A directional coupler operable at microwave and RF frequencies, comprising:
   a main transmission line supporting transverse electromagnetic (TEM) or quasi-TEM wave mode propagation;
   a coupled transmission line supporting TEM or quasi-TEM wave mode propagation, the coupled transmission line adjacent to and oriented at an angle with respect to the main transmission line, wherein the angle is nominally 60 degrees;
   a coupling hole formed through conductive shielding between the main and coupled lines, the coupling hole formed at an intersection region between the main and coupled lines;
   wherein the main transmission line is a main coaxial line, and the coupled transmission line is a coupled coaxial line, and the coupling hole comprises coupling holes formed in outer conductors of the main coaxial line and the coupled coaxial line; and
   wherein the coupled coaxial line has a smaller outer conductor diameter than the outer conductor diameter of the main coaxial line.

3. The coupler of claim 2, wherein the outer diameter of the main coaxial line is 7 mm or smaller, and the usable maximum frequency of the coupler is limited by the usable maximum frequency of the main coaxial line.

4. The coupler of claim 3, wherein said outer diameter is one of 1 mm, 1.85 mm, 2.4 mm, 2.92 mm, 3.5 mm and 7 mm.

5. A directional coupler operable at microwave and RF frequencies, comprising:
   a main coaxial transmission line segment, comprising an outer cylindrical main line conductor and a center main line conductor fitted concentrically within the outer main line conductor;
   a coupled coaxial transmission line segment adjacent to and oriented at an angle with respect to the main transmission line, wherein the angle is nominally 60 degrees and the coupled coaxial line has a smaller outer conductor diameter than the outer conductor diameter of the main coaxial line;
   a first coupling hole formed in the outer conductor of the coupled line, the coupling hole formed at an intersection region between the main and coupled lines; and
   a second coupling hole formed in the outer conductor of the main line at the intersection region.

6. The coupler of claim 5, further comprising an electrically conductive block structure, and wherein the outer conductors of the main and coupled coaxial lines are defined by first and second passageways formed through the block, and the first and second coupling holes are defined by an intersecting passageway defined through the block and communicating with the respective first and second passageways at the intersection area.

7. The coupler of claim 6, wherein the block has a hexagonal configuration with six faces oriented at 60 degrees relative to adjacent faces.

8. The coupler of claim 6, further comprising first and second main line input/output connectors connected to opposed faces of the block structure at opposed ends of the main line passageway, and first and second coupled line connectors connect to opposed faces of the block structure at opposed ends of the coupled line passageway.

9. The coupler of claim 5, wherein the outer diameter of the main coaxial line is 7 mm or smaller, and the usable maximum frequency of the coupler is limited by the usable maximum frequency of the main coaxial line.

10. The coupler of claim 9, wherein said outer diameter is one of 1 mm, 1.85 mm, 2.4 mm, 2.92 mm, 3.5 mm and 7 mm.

11. A directional slab line to coaxial coupler operable at microwave and RF frequencies, comprising:

a main transmission line, comprising a slab transmission line including opposed conductor slabs or planes and a center conductor positioned between the conductor planes;

a coupled coaxial transmission line comprising a cylindrical outer conductor and a center conductor concentrically positioned within the outer conductor, the coupled transmission line adjacent to and oriented at an angle with respect to the center conductor of the slab transmission line, and passing through holes formed in the opposed conductor planes;

a coupling hole formed in the outer conductor of the coupled coaxial line, the coupling hole formed at an intersection region between the center conductor and coupled line.

12. The coupler of claim 11, wherein the angle is nominally 60 degrees.

13. The coupler of claim 12, wherein the main slab line is integrated in an impedance tuner system, further comprising a probe carriage movable along the main center conductor, and the coupled coaxial line is positioned adjacent one end of the main center conductor of the impedance tuner system.

14. An impedance tuner, comprising:
a slab transmission line including opposed conductor slabs or planes and a center conductor positioned between the conductor planes;

one or more probe carriages mounted for movement through a range of movement in parallel with the center conductor;

a slab-line-to-coaxial-line directional coupler, comprising:

a coupled coaxial transmission line comprising a cylindrical outer conductor and a center conductor concentrically positioned within the outer conductor, the coupled transmission line adjacent to and oriented at an angle with respect to the center conductor of the slab transmission line, and passing through holes formed in the opposed conductor planes;

a coupling hole formed in the outer conductor of the coupled coaxial line, the coupling hole formed at an intersection region between the center conductor and coupled line.

15. The impedance tuner of claim 14, wherein the angle is nominally 60 degrees.

16. The impedance tuner of claim 14, wherein the directional coupler is positioned adjacent a first end of the center conductor outside the range of movement of the probe carriage.

17. A directional coupler operable at microwave and RF frequencies, comprising:
a main transmission line supporting transverse electromagnetic (TEM) or quasi-TEM wave mode propagation;

a coupled transmission line supporting TEM or quasi-TEM wave mode propagation, the coupled transmission line adjacent to and oriented at an angle with respect to the main transmission line, wherein the angle is nominally 60 degrees;

a coupling hole formed through conductive shielding between the main and coupled lines, the coupling hole formed at an intersection region between the main and coupled lines;

wherein the main transmission line is a main coaxial line, and the coupled transmission line is a coupled coaxial line, and the coupling hole comprises coupling holes formed in outer conductors of the main coaxial line and the coupled coaxial line; and wherein the outer diameter of the main coaxial line is 7 mm or smaller, and the usable maximum frequency of the coupler is limited by the usable maximum frequency of the main coaxial line.

18. The coupler of claim 17, wherein said outer diameter is one of 1 mm, 1.85 mm, 2.4 mm, 2.92 mm, 3.5 mm and 7 mm.

19. A directional coupler operable at microwave and RF frequencies, comprising:
a main coaxial transmission line segment, comprising an outer cylindrical main line conductor and a center main line conductor fitted concentrically within the outer main line conductor;

a coupled coaxial transmission line segment adjacent to and oriented at an angle with respect to the main transmission line, wherein the angle is nominally 60 degrees;

a first coupling hole formed in the outer conductor of the coupled line, the coupling hole formed at an intersection region between the main and coupled lines; and a second coupling hole formed in the outer conductor of the main line at the intersection region; and wherein the outer diameter of the main coaxial line is 7 mm or smaller, and the usable maximum frequency of the coupler is limited by the usable maximum frequency of the main coaxial line.

20. The coupler of claim 19, wherein said outer diameter is one of 1 mm, 1.85 mm, 2.4 mm, 2.92 mm, 3.5 mm and 7 mm.

* * * * *